US012765234B2

(12) United States Patent
Park et al.

(10) Patent No.: US 12,765,234 B2
(45) Date of Patent: Oct. 13, 2026

(54) DISPLAY DEVICE

(71) Applicant: LG Display Co., Ltd., Seoul (KR)

(72) Inventors: KyoungJin Park, Paju-si (KR); Sungsoo Gil, Gimpo-si (KR); Hyekyung Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 369 days.

(21) Appl. No.: 18/396,366

(22) Filed: Dec. 26, 2023

(65) Prior Publication Data

US 2024/0224726 A1 Jul. 4, 2024

(30) Foreign Application Priority Data

Dec. 29, 2022 (KR) ........................ 10-2022-0188661

(51) Int. Cl.
*H10K 59/80* (2023.01)

(52) U.S. Cl.
CPC .................................. *H10K 59/873* (2023.02)

(58) Field of Classification Search
CPC .... H10K 59/873; H10K 50/844; H10K 59/12; H10K 59/124
USPC .......................................................... 257/288
See application file for complete search history.

(56) References Cited

U.S. PATENT DOCUMENTS

2016/0285038 A1 9/2016 Kim
2019/0198587 A1 6/2019 Park et al.
2023/0180514 A1* 6/2023 Lee ..................... H10K 59/131

FOREIGN PATENT DOCUMENTS

KR 10-2013-0099586 A 9/2013
KR 10-2016-0116240 A 10/2016
KR 10-2019-0076093 A 7/2019

* cited by examiner

*Primary Examiner* — Tong-Ho Kim
(74) *Attorney, Agent, or Firm* — Morgan, Lewis & Bockius LLP

(57) ABSTRACT

A display device includes a substrate including a display area and a non-display area; a planarization layer over the substrate; a light-emitting element over the planarization layer in the display area; and a sealing layer over the light-emitting element, wherein an organic film of the sealing layer has a hydrophobic layer on a surface of an outer peripheral portion thereof.

19 Claims, 11 Drawing Sheets

DISPLAY DEVICE

CROSS-REFERENCE TO RELATED APPLICATIONS

This application claims the priority of Korean Patent Application No. 10-2022-0188661 filed on Dec. 29, 2022, in the Korean Intellectual Property Office, the disclosure of which is incorporated herein by reference.

BACKGROUND

Technical Field

The present disclosure relates to a display device, and more particularly, to a display device having a narrow bezel.

Discussion of the Related Art

Display devices, which visually display electrical information signals, have been rapidly developed in accordance with the full-fledged entry into the information era. Various studies are being continuously conducted to develop a variety of display devices that are thin and lightweight with low power consumption and improved performance.

As representative display device types, there are a liquid crystal display device (LCD), an electrowetting display device (EWD), an organic light-emitting display device (OLED), and the like. Among the display devices, electroluminescent display devices including the organic light-emitting display device refers to a display device that autonomously emits light. Unlike a liquid crystal display device, the electroluminescent display device does not require a separate light source and, thus, may be manufactured as a lightweight, thin display device. In addition, the electroluminescent display device is advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

Currently, there is an increasing need for a slim non-display area, except for a display area in which images are displayed, to meet the requirement of a slim display device. Therefore, the electroluminescent display device requires a minimum bezel distance to ensure reliability, such as inhibition of moisture. However, there is a limitation in reducing the bezel. If moisture penetrates into an outer peripheral portion of a sealing layer, a white stripe defect may occur on an outer periphery of a display panel because of a shift in threshold voltage Vth of an oxide thin-film transistor.

SUMMARY

Accordingly, embodiments of the present disclosure are directed to a display device that substantially obviates one or more of the problems due to limitations and disadvantages of the related art.

An aspect of the present disclosure is to provide a display device capable of suppressing moisture penetration into an outer periphery of a sealing layer.

Another of the present disclosure is to provide a display device capable of solving a problem of a white stripe defect on an outer periphery of a display panel by suppressing moisture penetration.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including a display area and a non-display area; a planarization layer over the substrate; a light-emitting element over the planarization layer in the display area; and a sealing layer over the light-emitting element, wherein an organic film of the sealing layer has a hydrophobic layer on a surface of an outer peripheral portion thereof.

In another aspect, a display device comprises a substrate including a display area and a non-display area; a light-emitting element over the substrate in the display area; a dam over the substrate in the non-display area and surrounding the display area in a plan view; and a sealing layer over the light-emitting element, wherein an organic film of the sealing layer is inside the dam in the plan view and has a hydrophobic layer on a surface of an outer peripheral portion thereof that contacts the dam.

In another aspect, a display device comprises a substrate including a display area and a non-display area; and a sealing layer over the substrate in the display area and the non-display area, wherein the sealing layer includes a hydrophobic layer in the non-display area to surround the display area.

The display devices according to present disclosure may avoid a white stripe defect by blocking outside moisture by additionally forming the hydrophobic layer on a part of the surface of the particle covering layer. Therefore, the present disclosure may improve the reliability of performance in suppressing moisture penetration while reducing the width of the bezel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
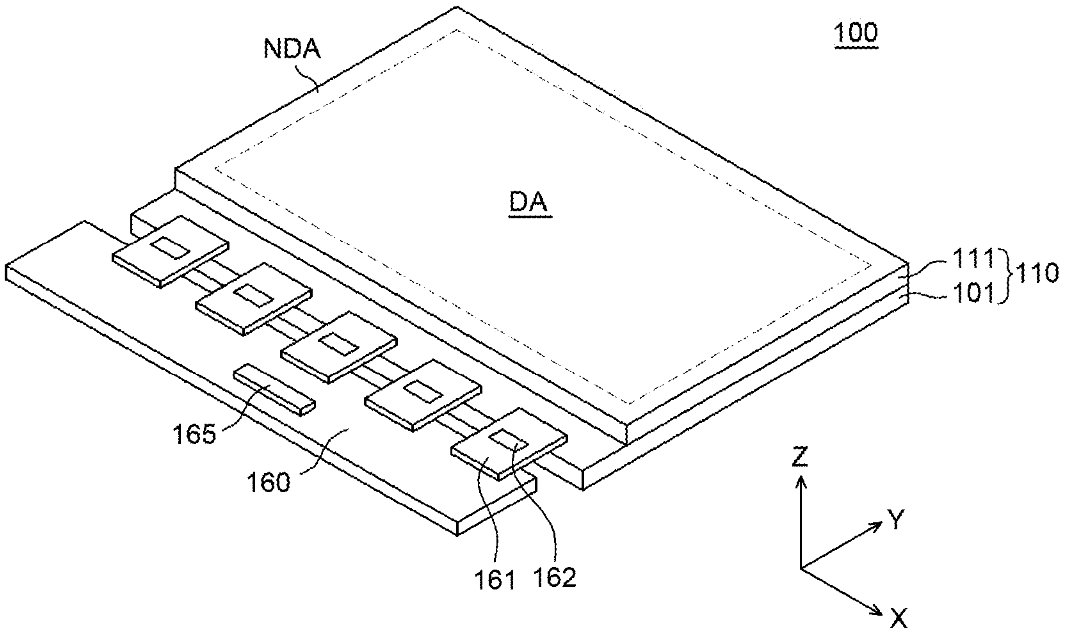
FIG. 1 is a perspective view illustrating a display device according to an example embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a perspective view illustrating a display device according to an example embodiment of the present disclosure.

With reference to FIG. 1, a display device 100 according to an example embodiment of the present disclosure may include a display panel 110, a gate drive part, source drive integrated circuits (hereinafter, referred to as "ICs") 162, flexible films 161, a circuit board 160, and a timing controller 165.

The flexible film 161 may be a flexible film. The circuit board 160 may be a printed circuit board. The timing controller 165 may be a timing controller.

The display panel 110 may include a first substrate 101 and a second substrate 111. The second substrate 111 may be a sealing substrate. The first substrate 101 and the second substrate 111 may each be made of plastic or glass.

Gate lines, data lines, and subpixels may be formed on one surface of the first substrate 101 that faces the second substrate 111.

The subpixel may be provided in an area defined by a structure in which the gate line and the data line intersect. The subpixels may each include a light-emitting element including a thin-film transistor, an anode, a plurality of organic layers, and a cathode.

When a gate signal is inputted from the gate line, each of the subpixels uses the thin-film transistor and supplies a predetermined electric current to the light-emitting element in response to a data voltage of the data line. Therefore, the light-emitting element of each of the subpixels may emit light with predetermined brightness in response to the predetermined electric current. The structure of each of the subpixels will be described below in detail with reference to FIG. 3.

For example, the display panel 110 may be divided into a display area DA in which the subpixels are formed and images are displayed, and a non-display area NDA that displays no image.

The gate lines, the data lines, and the subpixels may be formed in the display area DA. The gate drive part and pads may be formed in the non-display area NDA.

For example, the gate drive part may supply gate signals to the gate lines in response to a gate control signal inputted from the timing controller 165. For example, the gate drive part may be provided in the non-display area NDA at one side or two opposite edges of the display area DA of the display panel 110 in a GIP (Gate Driver In Panel) manner. However, the present disclosure is not limited thereto. The gate drive part may be manufactured in the form of a driving chip and mounted on the flexible film. The gate drive part may be attached to the non-display area NDA at one side or two opposite edges of the display area DA of the display panel 110 in a TAB (Tape Automated Bonding) manner.

For example, the source drive IC 162 may receive digital video data and a source control signal from the timing controller 165. The source drive IC 162 may convert the digital video data into analog data voltages in response to the source control signal and supply the analog data voltages to the data lines. In the case in which the source drive IC 162 is manufactured in the form of a driving chip, the source drive IC 162 may be mounted on the flexible film 161 in a COF (Chip On Film) manner or a COP (Chip On Plastic) manner.

The pads, such as data pads, may be formed in the non-display area NDA of the display panel 110. Lines, which connect the pads and the source drive IC 162, and lines, which connect the pads and lines of the circuit board 165, may be formed on the flexible film 161. The flexible film 161 is attached to the pads by an anisotropic conducting film (ACF), such that the pads and the lines of the flexible film 161 may be connected.

The circuit board 160 may be attached to the flexible films 161. A plurality of circuits, which is configured as driving chips, may be mounted on the circuit board 160. The timing controller 165 may be mounted on the circuit board 160. The circuit board 160 may be a printed circuit board or a flexible printed circuit board.

The timing controller 165 may receive the digital video data and a timing signal from an external system board through a cable of the circuit board 160. On the basis of the timing signal, the timing controller 165 may generate the gate control signal for controlling an operation timing of the gate drive part and generate the source control signal for controlling the source drive ICs 162. The timing controller 165 may supply the gate control signal to the gate drive part and supply the source control signal to the source drive ICs 162.

Figure 2:
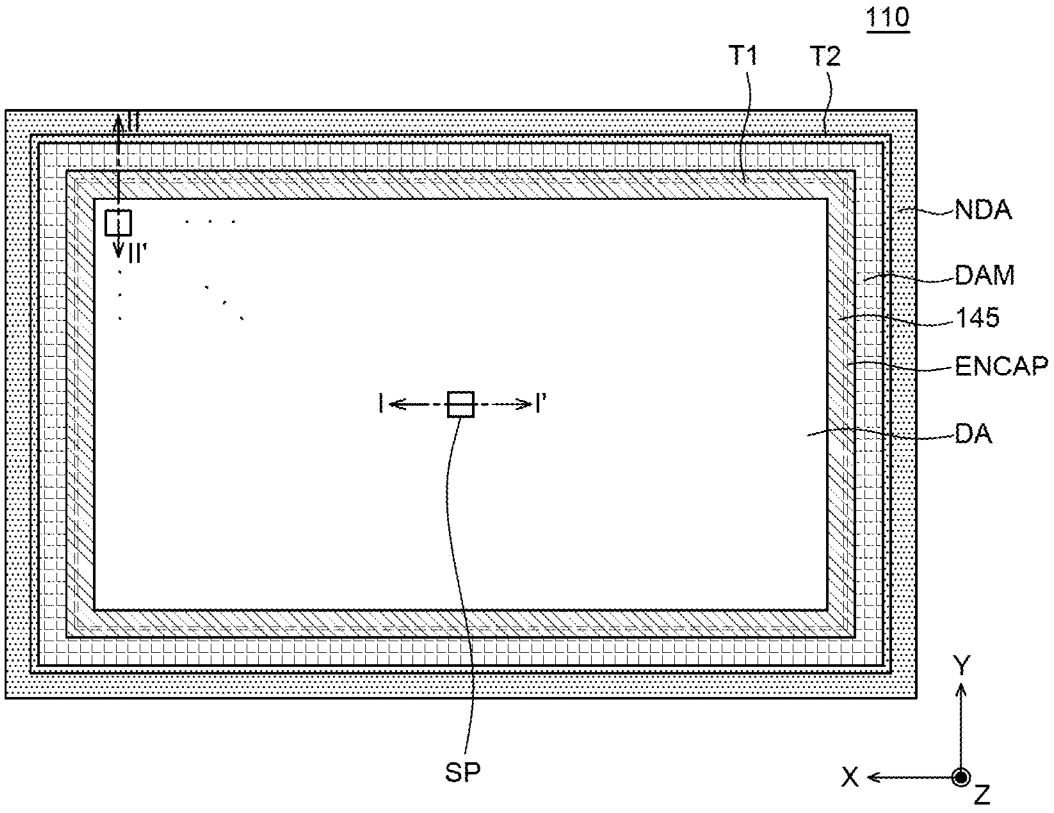
FIG. 2 is a top plan view schematically illustrating the display panel according to the example embodiment of the present disclosure.

FIG. 2 is a top plan view schematically illustrating the display panel according to an example embodiment of the present disclosure.

With reference to FIG. 2, the display panel 110 according to an example embodiment of the present disclosure may be divided into the display area DA and the non-display area NDA. A plurality of trenches T1 and T2 and a dam DAM may be formed in the non-display area NDA.

The display panel 110 is a panel configured to display images to a user.

For example, the display panel 110 may include a display element configured to display images, a driving element configured to operate the display element, and lines configured to transmit various types of signals to the display element and the driving element. Different display elements may be defined depending on the types of display panels 110. For example, in case that the display panel 110 is an electroluminescent display panel, the display element may be a light-emitting element including an anode, a plurality of organic layers, and a cathode. For example, in case that the display panel 110 is a liquid crystal display panel, the display element may be a liquid crystal display element.

Hereinafter, the illustrated example uses the display panel 110 as a electroluminescent display panel. However, the display panel 110 is not limited to the electroluminescent display panel.

The display panel 110 may include the display area DA and the non-display area NDA. The display area DA is an area of the display panel 110 in which images are displayed.

The display area DA may include a plurality of subpixels SP constituting a plurality of pixels, and a circuit configured to operate the plurality of subpixels SP. The plurality of subpixels SP is minimum units constituting the display area DA. The display element may be disposed in each of the plurality of subpixels SP. The plurality of subpixels SP may constitute the pixel. For example, the light-emitting element including the anode, the plurality of organic layers, and the cathode may be disposed on each of the plurality of subpixels SP. However, the present disclosure is not limited thereto. The circuit configured to operate the subpixel SP may include driving elements, lines, and the like. For example, the circuit may include a thin-film transistor, a storage capacitor, a gate line, a data line, and the like. However, the present disclosure is not limited thereto.

The non-display area NDA is an area in which no image is displayed. FIG. 2 illustrates that the non-display area NDA surrounds the display area DA having a quadrangular shape. However, the shapes and arrangements of the display area DA and the non-display area NDA are not limited to the example illustrated in FIG. 2.

For example, the display area DA and the non-display area NDA may each have a shape suitable for the design of an electronic device equipped with the electroluminescent display device. For example, an exemplary shape of the display area DA may also be a pentagonal shape, a hexagonal shape, a circular shape, an elliptical shape, or the like.

Various lines and circuits for operating the light-emitting element in the display area DA may be disposed in the non-display area NDA. For example, the non-display area NDA may include link lines for transmitting signals to the plurality of subpixels and the circuit in the display area DA. The non-display area NA may include a drive IC, such as a gate driver IC and a data driver IC. However, the present disclosure is not limited thereto.

The electroluminescent display device may include various additional elements configured to create various signals or operate the pixels in the display area DA. The additional elements for operating the pixel may include an inverter circuit, a multiplexer, an electrostatic discharge (ESD) circuit, and the like. The electroluminescent display device may also include additional elements related to functions other than the function of operating the pixel. For example, the electroluminescent display device may include additional elements that provide a touch detection function, a user certification function (e.g., fingerprint recognition), a multi-level pressure detection function, a tactile feedback function, and the like. The above-mentioned additional elements may be positioned in the non-display area NDA and/or an external circuit connected to a connection interface.

A sealing layer 140 may be positioned on an upper portion of the light-emitting element. The sealing layer 140 may have a single-layer structure or a multilayer structure. For example, the sealing layer 140 may include a primary protective film, an organic film, and a secondary protective film.

To inhibit the sealing layer 140 from being collapsed, one or more dams DAM may be disposed at an end point of an inclined surface of the sealing layer 140 or disposed at a position adjacent to the inclined surface of the sealing layer 140. The one or more dams DAM may be disposed at a boundary point between the display area DA and the non-display area NDA or disposed at a position adjacent to the boundary point. A second sealing layer including an organic material may be positioned only on a side surface in the dam DAM.

To ensure reliability, such as inhibition of penetration of moisture, the electroluminescent display device requires a minimum bezel distance. In addition, the non-display area NDA of the display device, except for the display area DA for displaying images, needs to have a slim size to meet the requirement of the slim display device. In addition, a shadow area is formed by a gap between a mask and a substrate at the time of depositing the cathode and the organic layer, which causes a limitation in reducing the bezel.

Therefore, in an example embodiment of the present disclosure, the plurality of trenches T1 and T2, which is made by partially removing the cathode and the organic layer, may be formed in the shadow area in the non-display area NDA. Therefore, in the example embodiment of the present disclosure, a rate of moisture penetration into a side surface of the display panel 110 may be delayed by the plurality of trenches T1 and T2. It is possible to reduce a width of the bezel by converting the existing shadow area into the reliable bezel area as described above. For example, when the reliable bezel area is added, the width of the bezel may be reduced by a length of the added reliable bezel area.

For example, the trenches T1 and T2 may be formed over four lateral portions of the non-display area NDA of the display panel 110. However, the present disclosure is not limited thereto. The trenches T1 and T2 may be disposed over three lateral portions on which the flexible film is not disposed among the four lateral portions of the display panel 110.

For example, the trenches T1 and T2 may include at least one first trench T1 disposed inside the dam DAM, and at least one second trench T2 disposed outside the dam DAM. However, the present disclosure is not limited thereto. In some instances, the first trench T1 disposed inside the dam DAM may not be included, or the second trench T2 disposed outside the dam DAM may not be included.

In addition, for example, in case that the width of the bezel is reduced, moisture penetrates into not only the side surface of the display panel but also the outer peripheral portion of the sealing layer during a process of evaluating high-temperature high-humidity reliability, such that a threshold voltage of an oxide thin-film transistor positioned on the outer periphery of the display panel is shifted. For this reason, a white stripe defect may occur on the outer periphery of the display panel. There is a limitation in suppressing moisture penetration into the outer peripheral portion of the sealing layer only by using the trenches T1 and T2.

Therefore, in an example embodiment of the present disclosure, a hydrophobic layer 145 may be additionally formed on a part of a surface of the organic film in the non-display area NDA, thereby suppressing a white stripe defect by blocking the introduction of moisture from an upper edge.

Figure 3:
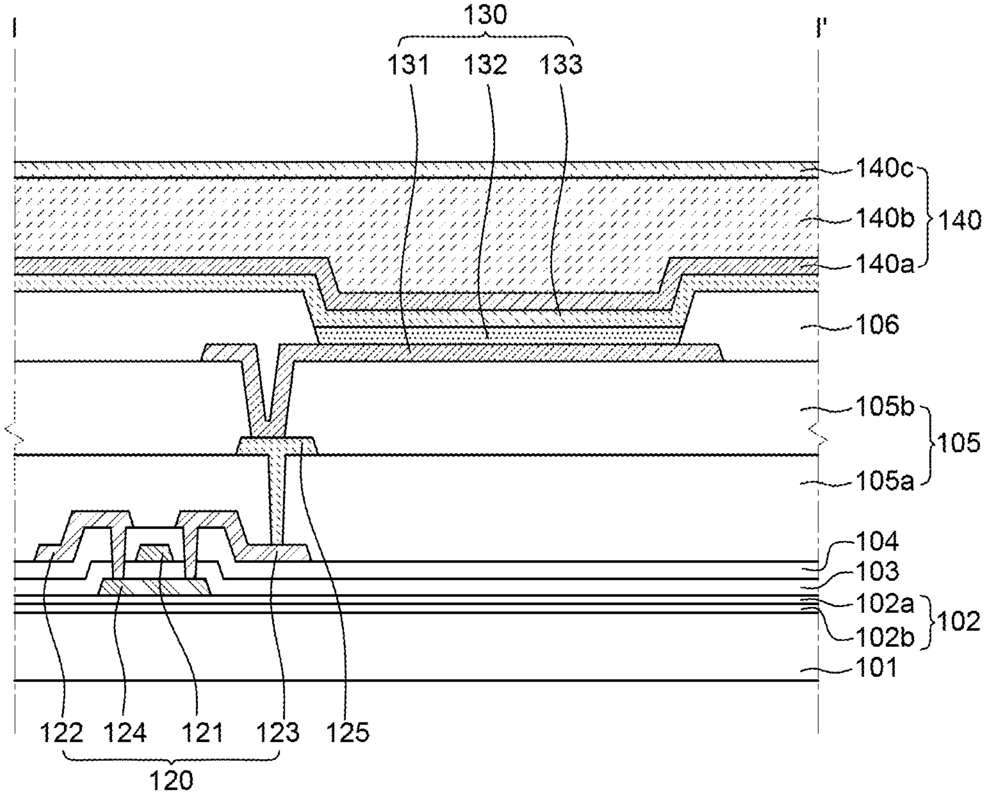
FIG. 3 is a cross-sectional view taken along line I-I' in FIG. 2.
Figure 4:
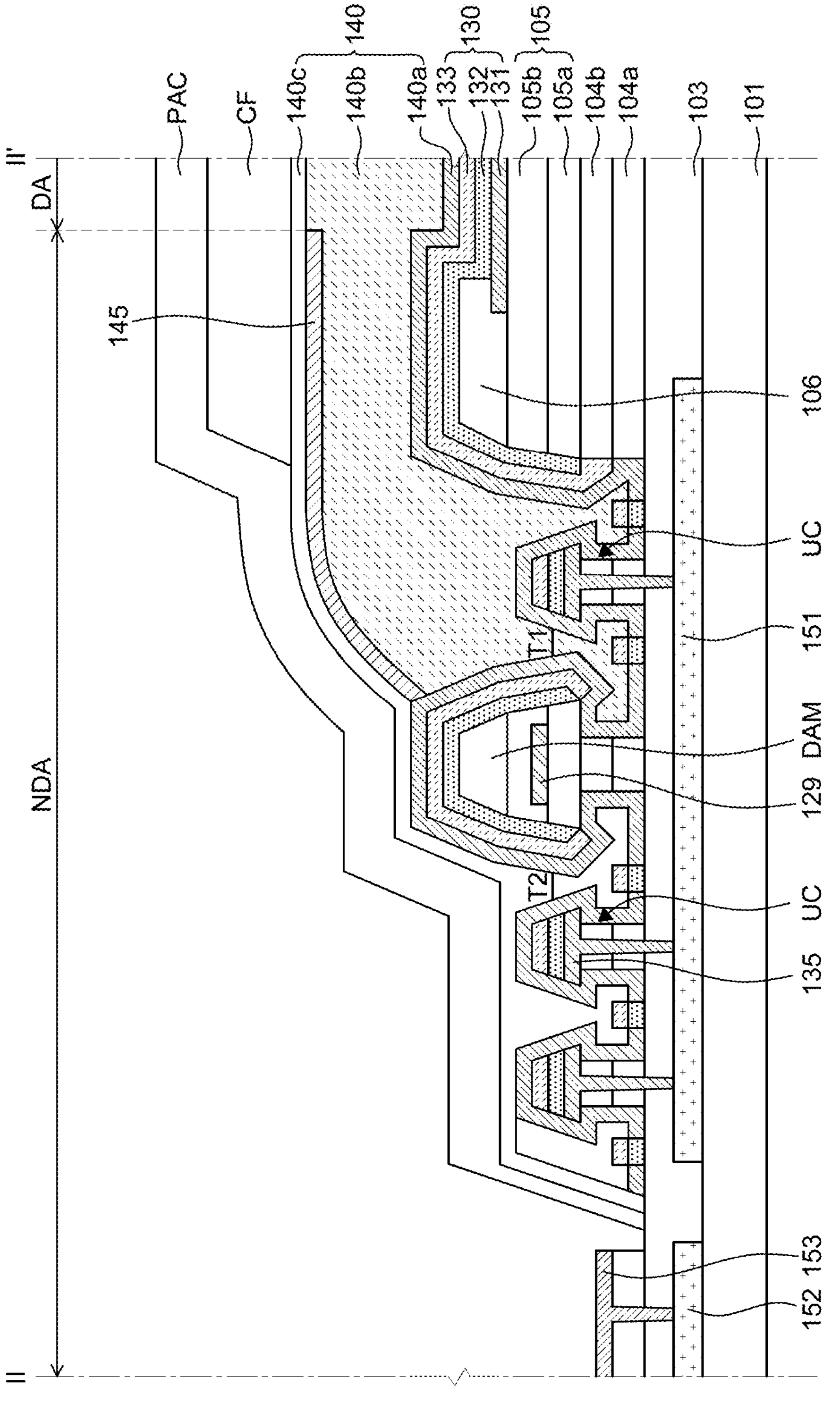
FIG. 4 is a cross-sectional view taken along line II-II' in FIG. 2.

The trenches T1 and T2 and the hydrophobic layer 145 of the present disclosure will be described in more detail with reference to FIG. 4. FIG. 3 is a cross-sectional view taken along line I-I' in FIG. 2. FIG. 4 is a cross-sectional view taken along line II-II' in FIG. 2.

FIG. 3 is a cross-sectional view of one subpixel of the display panel according to an example embodiment of the present disclosure. FIG. 4 illustrates a cross-section of an upper side of the display panel. For convenience, a driving element 120 in the display area DA is omitted from FIG. 4.

With reference to FIGS. 3 and 4, in the display panel according to an example embodiment of the present disclosure, the driving element 120 may be disposed on an upper portion of the substrate 101. The substrate 101 may be the first substrate, and the driving element 120 may be a driving transistor. However, the present disclosure is not limited to the terms.

A planarization layer 105 may be disposed on an upper portion of the driving element 120.

Further, a light-emitting element 130, which is electrically connected to the driving element 120, may be disposed on an upper portion of the planarization layer 105, and the sealing layer 140 having a multilayer structure may be disposed on an upper portion of the light-emitting element 130, thereby minimizing the penetration of oxygen and moisture into the light-emitting element 130.

A sealing substrate may be disposed on an upper portion of the sealing layer 140. However, the present disclosure is not limited thereto. The sealing substrate may be the second substrate. Although not illustrated, a touch layer may be disposed on the upper portion of the sealing layer 140.

As described above, the display panel according to an example embodiment of the present disclosure is not limited to the layered structure.

For example, the substrate 101 may be a glass or plastic substrate. If the substrate 101 is a plastic substrate, a polyimide-based material or a polycarbonate-based material is used, such that the substrate 101 may have flexibility. In particular, polyimide is widely used for the plastic substrate because polyimide is a material that may be applied to a high-temperature process and used for coating.

Although not illustrated, a light-blocking layer may be disposed on the substrate 101. The light-blocking layer may serve to protect an active layer 124 of the driving element 120. The light-blocking layer may be disposed on the upper portion of the substrate 101 so as to overlap the active layer 124 of the driving element 120. A width of the light-blocking layer may be equal to or larger than a width of the active layer 124 of the driving element 120. The light-blocking layer may be made of various metallic materials and be in a floating state in which no voltage is applied. However, alternatively, a constant voltage may be applied to the light-blocking layer.

A buffer layer 102 may be disposed on the upper portion of the substrate 101. The buffer layer 102 is a layer for protecting various types of electrodes and lines from impurities, such as alkaline ions leaking from the substrate 101 or lower layers. The buffer layer 102 may have a multilayer structure including a first buffer layer 102*a* and a second buffer layer 102*b*. However, the present disclosure is not limited thereto. The buffer layer 102 may be made of silicon oxide (SiOx) or silicon nitride (SiNx) or configured as a multilayer including silicon oxide (SiOx) or silicon nitride (SiNx).

In addition, the buffer layer 102 may delay the diffusion of moisture and/or oxygen that has penetrated into the substrate 101. The buffer layer 102 may include a multi-buffer and/or an active buffer. The active buffer may serve to protect the active layer 124 of the driving element 120, and the active layer 124 is made of a semiconductor. The active buffer may serve to block various types of impurities introduced from the substrate 101. The active buffer may be made of amorphous silicon (a-Si) or the like.

The buffer layer 102 may extend to the non-display area NDA of the substrate 101. However, the present disclosure is not limited thereto.

The driving element 120 may include the active layer 124, a gate electrode 121, a source electrode 122, and a drain electrode 123. The driving element 120 may be electrically connected to the light-emitting element 130 through a connection electrode 125 and transmit an electric current or signal to the light-emitting element 130.

The active layer 124 may be disposed on the buffer layer 102. The active layer 124 may be made of polysilicon (p-Si). In this case, a predetermined area of the active layer 124 may be doped with impurities. In addition, the active layer 124 may be made of amorphous silicon (a-Si) or various organic semiconductor materials, such as pentacene. In addition, the active layer 124 may be made of an oxide semiconductor.

A gate insulation layer 103 may be disposed on the active layer 124. The gate insulation layer 103 may be made of an insulating inorganic material, such as silicon oxide (SiOx) or silicon nitride (SiNx). In addition, the gate insulation layer 103 may be made of an insulating organic material or the like.

The gate electrode 121 may be disposed on the gate insulation layer 103. The gate electrode 121 may be made of various electrically conductive materials, for example, nickel (Ni), chromium (Cr), magnesium (Mg), aluminum (Al), molybdenum (Mo), tungsten (W), gold (Au), or an alloy thereof.

For example, a voltage line 151 may be disposed on the substrate 101 of the non-display area NDA. The voltage line 151 may be a low-potential power line. For example, the voltage line 151 may be disposed on the same layer as a gate layer. However, the present disclosure is not limited thereto.

In addition, a first pad electrode 152 may be disposed on the substrate 101 of the non-display area NDA. The first pad electrode 152 may be disposed on the same layer as the voltage line 151. However, the present disclosure is not limited thereto. The first pad electrode 152 may be disposed only at one side of the display panel at which a pad part is positioned.

An interlayer insulation layer 104 may be disposed on the gate electrode 121. The interlayer insulation layer 104 may be made of an insulating material, such as silicon oxide (SiOx) or silicon nitride (SiNx). In addition, the interlayer insulation layer 104 may be made of an insulating organic material or the like. The interlayer insulation layer 104 may include a first interlayer insulation layer 104*a* and a second interlayer insulation layer 104*b*. However, the present disclosure is not limited thereto.

A contact hole, through which source and drain areas of the active layer 124 are exposed, may be formed by selectively removing the gate insulation layer 103 and the interlayer insulation layer 104. The source electrode 122 and the drain electrode 123 may be disposed on the interlayer insulation layer 104. The source electrode 122 and the drain electrode 123 may each have a single-layer or multilayer structure disposed on the interlayer insulation layer 104 and made of a material for an electrode.

As necessary or desired, an additional protective layer (passivation layer) made of an inorganic insulating material may be disposed to cover the source electrode 122 and the drain electrode 123. The additional protective layer may be the second interlayer insulation layer 104*b*.

The planarization layer 105 may be disposed on an upper portion of the driving element 120 configured as described above. The planarization layer 105 may have a multilayer structure including at least two layers. For example, the planarization layer 105 may include a first planarization layer 105*a* and a second planarization layer 105*b*. The first planarization layer 105*a* may be disposed to cover the driving element 120 and disposed so that the source electrode 122 or the drain electrode 123 of the driving element 120 is partially exposed.

A part of the planarization layer 105 may be disposed in the non-display area NDA and constitute a part of the dam DAM. The planarization layer 105 may be an overcoat layer. However, the present disclosure is not limited thereto.

The connection electrode 125 may be disposed on the first planarization layer 105*a* and electrically connect the driving element 120 and the light-emitting element 130. In addition, although not illustrated, various metal layers may be disposed on the first planarization layer 105*a* and serve as electrodes and lines, such as data lines or signal lines.

A source/drain metal 129 may be disposed on the first planarization layer 105*a* of the non-display area NDA. For example, the source/drain metal 129 may be disposed on the same layer and made of the same conductive material as the connection electrode 125. However, the present disclosure is not limited thereto. In addition, the source/drain metal 129 may constitute a part of the dam DAM. In addition, the second planarization layer 105*b* may be disposed on an upper portion of the first planarization layer 105*a* and an upper portion of the connection electrode 125.

In the display panel of an example embodiment of the present disclosure, the configuration in which the planarization layer 105 is provided as two layers is based on the fact that the number of various types of signal lines increases as the display panel has high resolution. The additional layer is provided because it is difficult to dispose all the lines on a single layer while ensuring minimum intervals. The addition of the additional layer, e.g., the second planarization layer 105*b* may provide a margin for disposing lines, which facilitates the disposition design of lines/electrodes. In addition, in case that a dielectric material is used for the planarization layer 105 having a multilayer structure, the planarization layer 105 may serve to create capacitance between metal layers.

For example, the second planarization layer 105*b* may be disposed such that a part of the connection electrode 125 is exposed. The drain electrode 123 of the driving element 120 and an anode 131 of the light-emitting element 130 may be electrically connected by the connection electrode 125.

Meanwhile, the light-emitting element 130 may be configured by sequentially disposing the anode 131, a plurality of organic layers 132, and a cathode 133. For example, the light-emitting element 130 may include the anode 131 disposed on an upper portion of the planarization layer 105, the organic layer 132 disposed on the anode 131, and the cathode 133 disposed on the organic layer 132.

The electroluminescent display device may be implemented as a top emission type or a bottom emission type. In the case of the top emission type, a reflective layer made of an opaque conductive material with high reflectance, for example, silver (Ag), aluminum (Al), gold (Au), molybdenum (Mo), tungsten (W), chromium (Cr), or an alloy thereof may be additionally disposed on a lower portion of the anode 131 so that light, which is emitted from the organic layer 132, is reflected by the anode 131 and propagates upward, e.g., in a direction toward the cathode 133 at the upper side. In contrast, in the case of the bottom emission type, the anode 131 may be made of only a transparent electrically conductive material, such as indium tin oxide (ITO), indium zinc oxide (IZO), or indium gallium zinc oxide (IGZO). Hereinafter, the description will be made on the assumption that the display panel of the present disclosure is the top emission type.

A second pad electrode 153 may be disposed on the upper portion of the substrate 101 of the non-display area NDA. The second pad electrode 153 may be disposed on the same layer as the anode 131. However, the present disclosure is not limited thereto. The second pad electrode 153 may be electrically connected to the first pad electrode 152 disposed below the second pad electrode 153. The second pad electrode 153 may be disposed only at one side of the display panel at which the pad part is positioned.

Further, for example, a part of the anode 131 may be disposed in the non-display area NDA and constitute a plurality of auxiliary electrodes 135. The auxiliary electrode 135 may be provided as a plurality of auxiliary electrodes 135 disposed inside and outside the dam DAM. The auxiliary electrode 135 may be electrically connected to the voltage line 151 disposed below the auxiliary electrode 135.

The plurality of trenches T1 and T2 may be formed between the plurality of auxiliary electrodes 135. For example, the first trench T1 may be formed between the dam DAM and the auxiliary electrode 135 disposed inside the dam DAM, and the second trench T2 may be formed between the dam DAM and the auxiliary electrode 135 disposed outside the dam DAM.

For example, undercut structures UC may be formed in lower portions of the plurality of auxiliary electrodes 135 and a lower portion of the dam DAM. The undercut structures UC may be formed in side surfaces of the lower portions of the plurality of auxiliary electrodes 135 and a side surface of the lower portion of the dam DAM. The gate insulation film 103 and/or the interlayer insulation film 104 between the plurality of auxiliary electrodes 135 and between the auxiliary electrode 135 and the dam DAM are removed by the undercut structure UC, such that the plurality of trenches T1 and T2 may be formed. The auxiliary electrodes 135 may be disposed at four edges of the display panel. However, the present disclosure is not limited thereto.

A bank 106 may be provided on the planarization layer 105 and disposed in the remaining area excluding the light-emitting area. The bank 106 may have a bank hole through which the anode 131 corresponding to the light-emitting area is exposed. The bank 106 may be made of an inorganic insulating material, such as silicon nitride (SiNx) or silicon oxide (SiOx), or made of an organic insulating material, such as BCB, acrylic resin, or imide-based resin.

For example, a part of the bank 106 may be disposed in the non-display area NDA and constitute a part of the dam DAM.

The organic layer 132 may be disposed on the anode 131 exposed by the bank 106. The organic layer 132 may include a light-emitting layer, an electron injection layer, an electron transport layer, a hole transport layer, a hole injection layer, and the like.

The organic layer 132 may extend to the non-display area NDA but be disconnected by the plurality of trenches T1 and T2 and the undercut structure UC. A part of the organic layer 132 may be disposed on lower portions of the plurality of trenches T1 and T2 and disposed on the auxiliary electrode 135. In addition, a part of the organic layer 132 may be disposed on the bank 106 so as to surround the side surface of the dam DAM. The cathode 133 may be disposed on the organic layer 132.

In the case of the top emission type, the cathode 133 may include a transparent electrically conductive material. For example, the cathode 133 may be made of indium tin oxide (ITO), indium zinc oxide (IZO), indium gallium zinc oxide (IGZO), or the like. In the case of the bottom emission type, the cathode 133 may include any one selected from a group consisting of metallic materials, such as gold (Au), silver (Ag), aluminum (Al), molybdenum (Mo), magnesium (Mg), palladium (Pd), and copper (Cu) or an alloy thereof. Alternatively, the cathode 133 may be configured by stacking a layer made of a transparent electrically conductive material, such as indium tin oxide (ITO), indium zinc oxide (IZO), or indium gallium zinc oxide (IGZO), and a layer made of metallic materials, such as gold (Au), silver (Ag) aluminum (Al), molybdenum (Mo), magnesium (Mg), palladium (Pd), and copper (Cu) or an alloy thereof. However, the present disclosure is not limited thereto.

The cathode 133 may extend to the non-display area NDA. For example, the cathode 133 may extend to the non-display area NDA but be disconnected by the plurality of trenches T1 and T2 and the undercut structure UC. A part of the cathode 133 may be disposed on the organic layer 132 on the lower portions of the plurality of trenches T1 and T2 and the upper portion of the auxiliary electrode 135. In addition, a part of the cathode 133 may be disposed on the organic layer 132 so as to surround the side surface of the dam DAM.

Although not illustrated, a capping layer may be disposed on the upper portion of the light-emitting element 130 and made of a material with a large refractive index and a high optical absorption rate to reduce irregular reflection of external light. The capping layer may be an organic material layer made of an organic material.

The capping layer may extend to the non-display area NDA. Even in this case, the capping layer may be disconnected by the plurality of trenches T1 and T2 and the undercut structure UC.

Meanwhile, the sealing layer 140 having a multilayer structure may be disposed on the upper portion of the light-emitting element 130. The elements, such as the light-emitting elements 130, which use organic materials, are vulnerable to gas in the atmosphere, for example, moisture or oxygen and have low durability against heat. Therefore, a thorough sealing process is required.

If an appropriate sealing process is not performed, a lifespan of the element may rapidly deteriorate, and a dark spot is formed in the element, which may cause a defective product. On the contrary, in case that an appropriate sealing process is applied during the process of manufacturing the element, it is possible to ensure reliability of the element and produce the high-quality element.

Typically, the sealing processes are broadly classified into two types of sealing processes. One sealing process is a covering process of attaching a moisture absorbent (getter) into a cover made of glass or metal and attaching the cover to an element by using a bonding agent having water permeability. The other sealing process is a thin-film sealing process of stacking various types of layers and attaching the stack to the light-emitting element or depositing a film directly on the light-emitting element. Among the sealing processes, the film used for the thin-film sealing process may be mainly made of materials having excellent oxygen-blocking properties and excellent water vapor-blocking properties.

The sealing layer 140 will be specifically described. For example, the capping layer is formed on a top surface of the substrate 101 having the light-emitting element 130 disposed thereon, and a primary protective film 140*a*, an organic film 140*b*, and a secondary protective film 140*c* are sequentially formed on the capping layer, thereby configuring the sealing layer 140 that is a sealing mean. However, the number of inorganic and organic films constituting the sealing layer 140 is not limited thereto.

The primary protective film 140*a* may be provided to be closest to the light-emitting element 130 and disposed on the upper portion of the substrate 101 on which the cathode 133 is disposed.

For example, the primary protective film 140*a* may be made of an inorganic insulating material, such as silicon nitride (SiNx), silicon oxide (SiOx), oxidation silicon nitride (SiON), or aluminum oxide ($Al_2O_3$) that may be deposited at a low temperature. Because the primary protective film 140*a* is deposited in a low-temperature ambience, it is possible to suppress damage to the organic layer 132 vulnerable to a high-temperature ambience during the deposition process.

The primary protective film 140*a* may be disposed on the cathode 133 on the upper portion of the dam DAM and the upper portion of the auxiliary electrode 135. For example, the primary protective film 140*a* may be disposed on the side surface of the dam DAM and the side surface of the auxiliary electrode 135 and the side surfaces of the trenches T1 and T2. The primary protective film 140*a* may expose the second pad electrode 153 of the pad part.

The organic film 140*b* may be disposed in a smaller area than the primary protective film 140*a*. The organic film 140*b* may be configured to expose two opposite ends of the primary protective film 140*a*.

The organic film 140*b* may serve as a buffer for mitigating stress between the layers caused when the electroluminescent display device is bent. The organic film 140*b* may also serve to improve the planarization performance. The organic film 140*b* may be a particle covering layer. For example, the organic film 140*b* may be made of an organic insulating material, such as acrylic resin, epoxy resin, polyimide, polyethylene, or silicon oxycarbon (SiOC).

In case that the organic film 140*b* is formed by an inkjet method, the one or two or more dams DAM may be disposed in a boundary area between the non-display area NDA and the display area DA and in a partial area in the non-display area NDA. The dams DAM may be disposed at four edges of the display panel. However, the present disclosure is not limited thereto.

When the liquid organic film 140*b* is dropped on the display area DA, the dam DAM may inhibit the liquid organic film 140*b* from invading the pad part by being collapsed in a direction toward the non-display area NDA. The dam DAM may have a single-layer or multilayer structure. For example, the dam DAM may be configured simultaneously with and made of the same material as at least any one of the bank 106, the planarization layer 105, and the like. In this case, it is possible to configure the dam DAM without a process of adding a mask and an increase in costs.

In addition, the organic film 140*b* including an organic material may be provided only in the dam DAM. The organic film 140*b* may be disposed in the first trench T1 disposed inside the dam DAM. For example, the organic film 140*b* may fill the inside of the first trench T1.

Meanwhile, in an example embodiment of the present disclosure, the hydrophobic layer 145 may be formed on a part of the surface of the organic film 140*b* of the non-display area NDA. Therefore, it is possible to suppress a white stripe defect by blocking moisture penetration into the outer peripheral portion of the bezel or the outer peripheral portion of the sealing layer 140. Therefore, the present disclosure may improve the reliability of performance in suppressing moisture penetration while reducing the width of the bezel.

For example, the hydrophobic layer 145 may be provided in the boundary area between the non-display area NDA and the display area DA and formed to the primary protective film 140*a* disposed on the upper side of the dam DAM. The hydrophobic layer 145 may not be formed in the display area DA. Therefore, an optical loss caused by the hydrophobic layer 145 does not occur. For example, the hydrophobic layer 145 may be a hydrophobic fluorine film.

The secondary protective film 140*c* may be disposed to cover the top surface and the side surface of the primary protective film 140*a* and the top surface and the side surface of the organic film 140*b*. The secondary protective film 140*c* may serve to minimize or block the penetration of outside moisture or oxygen into the primary protective film 140*a* and the organic film 140*b*. For example, the secondary protective film 140*c* may be made of an inorganic insulating material, such as silicon nitride (SiNx), silicon oxide (SiOx), oxidation silicon nitride (SiON), or aluminum oxide ($Al_2O_3$).

The secondary protective film 140*c* may be disposed on the primary protective film 140*a* on the upper portion of the dam DAM and the upper portion of the auxiliary electrode 135.

The secondary protective film 140*c* may expose the second pad electrode 153 of the pad part.

A color filter CF may be disposed on the secondary protective film 140*c*. However, the present disclosure is not limited thereto. The color filter CF may be disposed to correspond to the light-emitting area in the display area DA. The color filter CF may extend to a part of the non-display area NDA.

A protective layer PAC may be disposed on a front surface of the substrate 101 including the secondary protective film 140*c*. The protective layer PAC may be a PAC layer formed at a low temperature. The protective layer PAC may expose the second pad electrode 153 of the pad part.

Figure 5A:
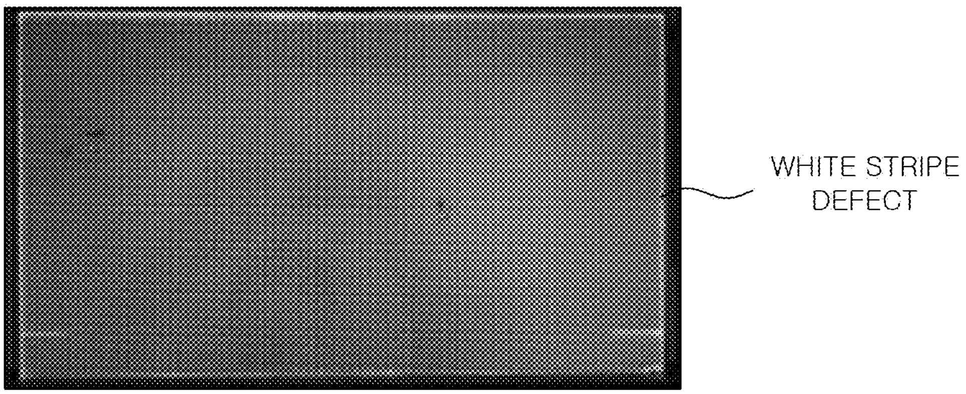
FIGS. 5A and 5B are photographs showing results of evaluating high-temperature high-humidity reliability.
Figure 5B:
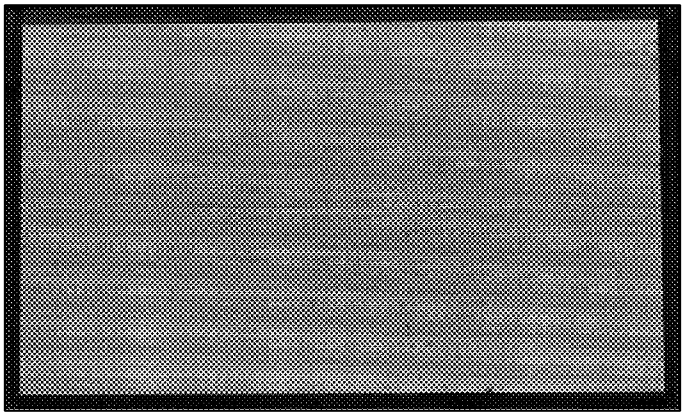

Hereinafter, the hydrophobic layer 145 of the present disclosure will be described in more detail. FIGS. 5A and 5B are photographs showing results of evaluating high-temperature high-humidity reliability.

FIG. 5A illustrates a result of evaluating high-temperature, high-humidity reliability in the case of a comparative example to which no hydrophobic layer is applied, and FIG. 5B illustrates a result of evaluating high-temperature, high-humidity reliability in the case of an example embodiment to which the hydrophobic layer is applied.

With reference to FIG. 5A, it can be seen that in the case of the comparative example to which no hydrophobic layer is applied, a white stripe defect occurs on an outer periphery of a display panel after the evaluation of the high-temperature, high-humidity reliability.

In contrast, with reference to FIG. 5B, it can be seen that in the case of an example embodiment to which the hydrophobic layer is applied, the hydrophobic layer including the hydrophobic fluorine blocks moisture penetrating from the outside, such that a white stripe defect occurring on the outer periphery of the display panel is eliminated after the evaluation of the high-temperature, high-humidity reliability.

Figure 6A:
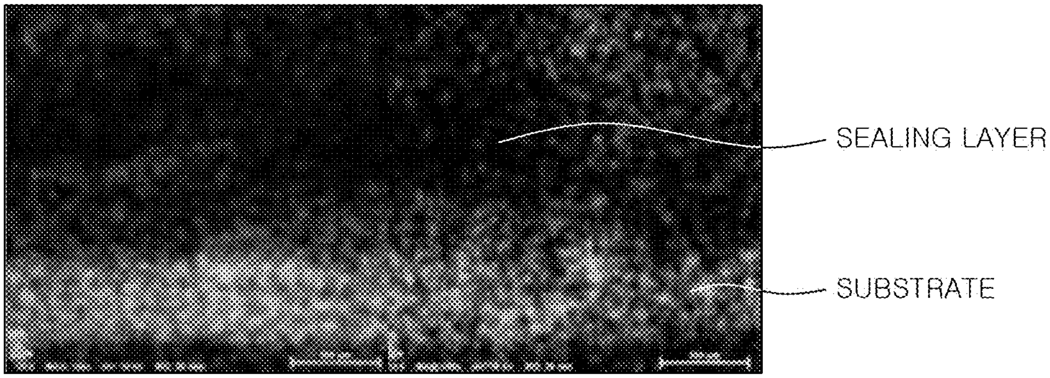
FIGS. 6A and 6B are images showing the distribution of oxygen (O) before and after evaluation of moisture penetration related to a comparative example.
Figure 6B:
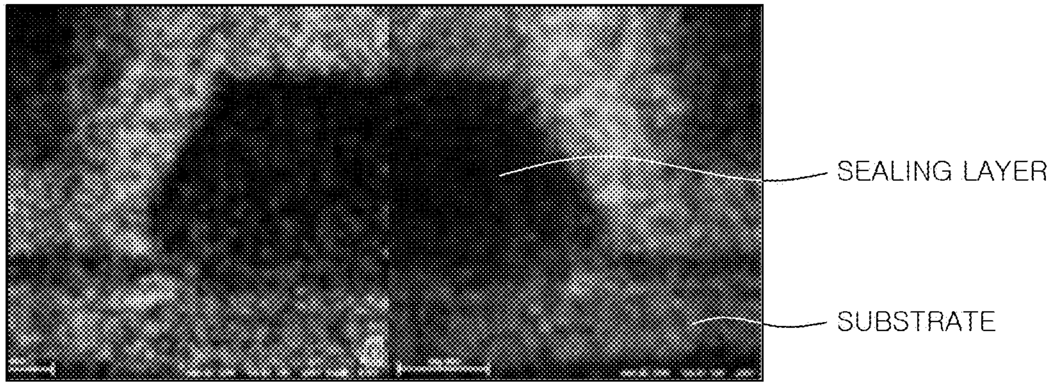
Figure 7A:
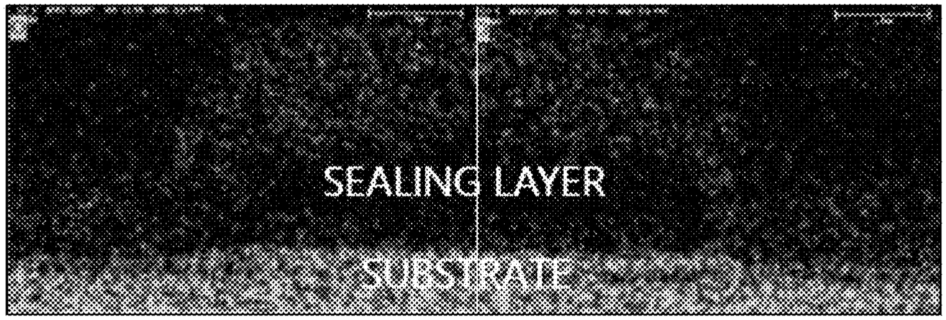
FIGS. 7A and 7B are images showing the distribution of oxygen (O) before and after evaluation of moisture penetration related to an example embodiment.
Figure 7B:
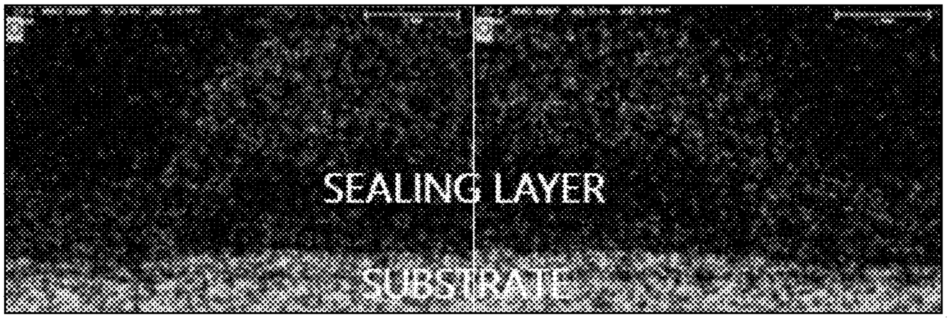

FIGS. 6A and 6B are images showing the distribution of oxygen (O) before and after evaluation of moisture penetration related to a comparative example. FIGS. 7A and 7B are images showing the distribution of oxygen (O) before and after evaluation of moisture penetration related to an example embodiment.

FIGS. 6A and 6B illustrate the distribution of oxygen (O) before and after the evaluation of moisture penetration related to the comparative example to which no hydrophobic layer is applied. FIGS. 7A and 7B illustrate the distribution of oxygen (O) before and after the evaluation of moisture penetration related to an example embodiment to which the hydrophobic layer is applied. FIGS. 6A, 6B, 7A, and FIG. 7B illustrate the distribution of oxygen (O) before and after the evaluation of moisture penetration in the state in which the sealing layer is disposed on the upper portion of the substrate at the lower side.

With reference to FIGS. 6A and 6B, it can be seen that in the case of the comparative example to which no hydrophobic layer is applied, oxygen is partially present in the substrate before the evaluation of moisture penetration. Further, it can be seen that oxygen is present even on the sealing layer on the upper portion of the substrate after the evaluation of moisture penetration. For example, it can be seen that the secondary protective film of the sealing layer made of silicon nitride (SiNx) is oxidized into silicon oxide (SiOx) by moisture penetration, and thus hydrogen is produced, and a coupling structure is changed, such that moisture penetration progresses.

In contrast, with reference to FIGS. 7A and 7B, it can be seen that in the case of an example embodiment to which the hydrophobic layer is applied, the hydrophobic layer blocks moisture penetrating from the outside, such that the oxidation of the secondary protective film may be suppressed, and the distribution of oxygen does not change before and after the evaluation of moisture penetration. The hydrophobic layer of the present disclosure may be formed by adding fluorine to the surface of the organic film and then providing hydrophobic properties through selective photocuring.

Figure 8A:
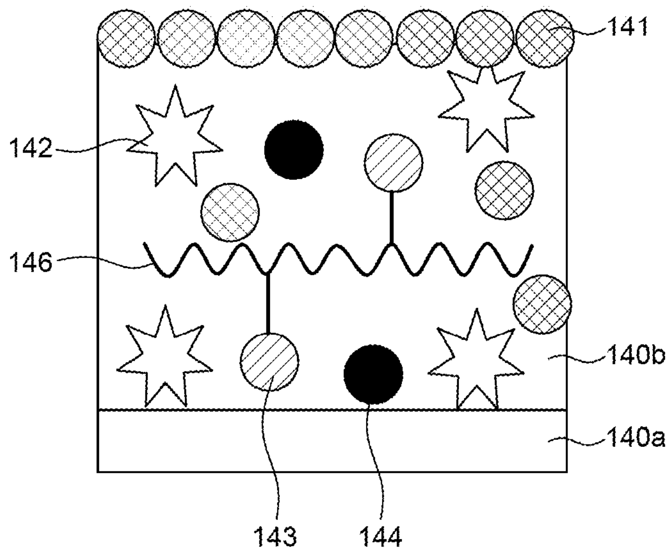
FIGS. 8A and 8B are views exemplarily illustrating a process of forming a hydrophobic layer of the present disclosure.
Figure 8B:
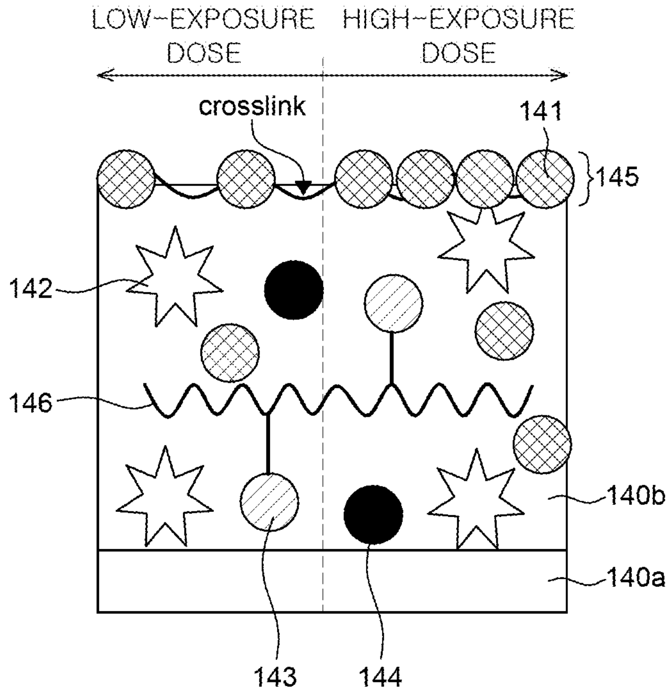
Figure 9A:
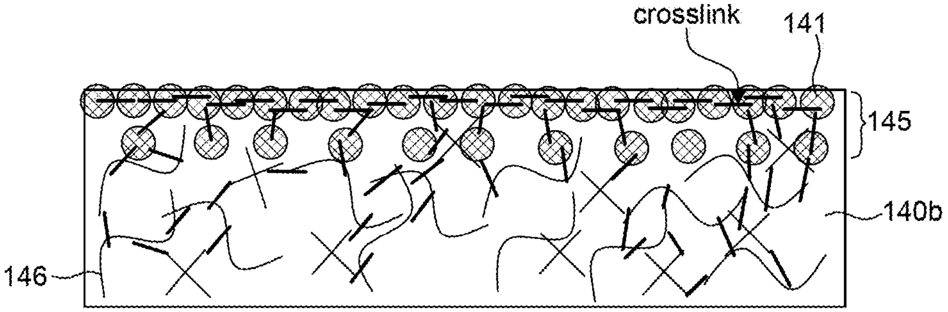
FIGS. 9A and 9B are views illustrating whether the hydrophobic layer is formed in accordance with the presence or absence of exposure.
Figure 9B:
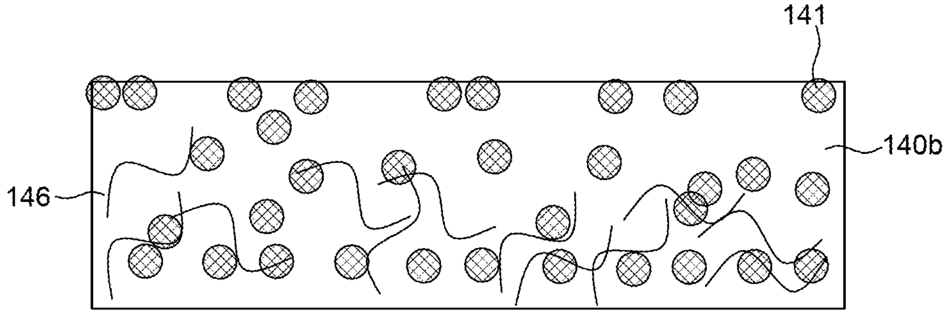

FIGS. 8A and 8B are views exemplarily illustrating a process of forming the hydrophobic layer of the present disclosure. FIGS. 9A and 9B are views illustrating whether the hydrophobic layer is formed in accordance with the presence or absence of exposure.

FIG. 8A illustrates a state of the organic film after pre-baking is performed, and FIG. 8B illustrates a state of the organic film after UV exposure. The left side of FIG. 8B illustrates a state of the organic film with a low-exposure dose, and the right side of FIG. 8B illustrates a state of the organic film with a high-exposure dose. FIG. 9A illustrates a state of the organic film on a non-exposed portion in a positive type, and FIG. 9B illustrates a state of the organic film on an exposed portion.

With reference to FIG. 8A, the organic film 140*b* may be deposited on the primary protective film 140*a*. For example, the primary protective film 140*a* may be made of an inorganic insulating material, such as silicon nitride (SiNx), silicon oxide (SiOx), oxidation silicon nitride (SiON), or aluminum oxide ($Al_2O_3$) that may be deposited at a low temperature.

In addition, for example, the organic film 140*b* may be made of an organic insulating material, such as acrylic resin, epoxy resin, polyimide, polyethylene, or silicon oxycarbon (SiOC). The organic film 140*b* may serve as a buffer for mitigating stress between the layers caused when the electroluminescent display device is bent. The organic film 140*b* may also serve to improve the planarization performance. The organic film 140*b* may be a particle covering layer that covers foreign substances.

For example, the organic film 140*b* may include first monomers 142, second monomers 143, and initiators 144. The second monomer 143 may be a functional group. In addition, the initiator 144 may be a UV initiator or a thermal initiator. The second monomers 143 may be coupled to each other by a monomer main chain 146.

A photoreactive fluorine additive 141 may be added to a surface of the organic film 140*b*. The fluorine additive 141 may be a UV reactive material that reacts with UV When the organic film 140*b* to which the fluorine additive 141 is added is pre-baked, the fluorine additive 141 may be raised to the surface of the organic film 140*b* during the pre-baking process.

With reference to FIG. 8B, when the UV exposure process is performed after the pre-baking process, the hydrophobic layer 145 may be formed on the surface of the organic film 140*b* in a state in which the fluorine additive 141 is kept hydrophobic by cross-linking. For example, the fluorine additive 141 may maintain hydrophobic properties as polymer cross-linking is carried out during the exposure process.

For example, in the hydrophobic layer 145, a hydrophobic sub-polymer may be cross-linked to a main polymer. The hydrophobic sub-polymer may have a coupling structure, such as UV-sensitive groups of epoxy, polyimide, and acrylate on a body of a hydrophobic introduction portion.

The degree of hydrophobicity of the hydrophobic layer 145 may be controlled by a UV exposure dose. For example, the hydrophobic layer 145 with higher hydrophobicity may be formed by UV irradiation with an exposure dose higher than a low exposure dose.

The hydrophobic layer 145 may be formed to have a thickness of 100 nm or less. However, the present disclosure is not limited thereto.

As described above, the degree of photocuring of the hydrophobic layer 145 may be adjusted on the basis of the UV exposure dose. It is possible to block moisture penetrating from the outside by forming the hydrophobic layer 145 by irradiating the outer peripheral portion of the organic film 140*b* with a sufficient amount of light.

Meanwhile, with reference to FIG. 9A, in the case of the positive type, the non-exposed portion is covered by a mask and is not irradiated with UV rays, such that the hydrophobic layer 145 may be formed on the surface of the organic film 140*b* in the state in which hydrophobicity is maintained by cross-linking. In contrast, with reference to FIG. 9B, in the case of the positive type, the exposed portion is not covered by the mask and is irradiated with UV rays, such that the cross-linking properties are broken, and the hydrophobic layer 145 cannot be formed on the surface of the organic film 140*b*.

In this case, a width of the hydrophobic layer is determined by a size (width) of the mask, such that the width of the hydrophobic layer may be selectively controlled.

On the contrary, in the case of the negative type, the exposed portion is not covered by the mask and is irradiated with UV rays, such that the hydrophobic layer 145 may be formed on the surface of the organic film 140*b* in the state in which hydrophobicity is maintained by cross-linking. In addition, in the case of the negative type, the non-exposed portion is covered by the mask and is irradiated with UV rays, and the cross-linking is not carried out, such that the hydrophobic layer 145 cannot be formed on the surface of the organic film 140*b*.

Figure 10:
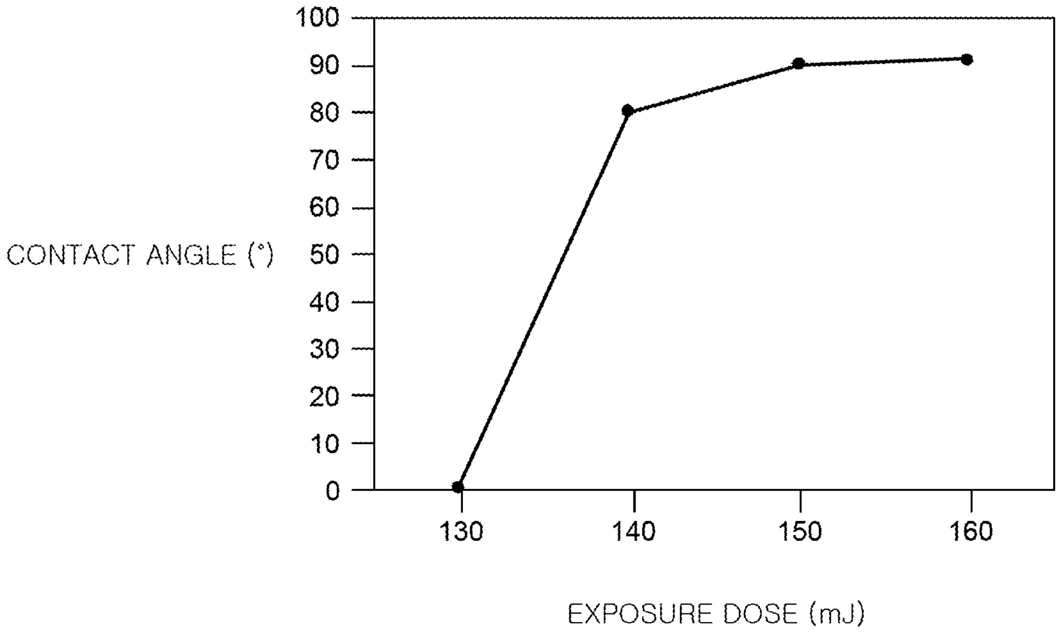
FIG. 10 is a graph showing a contact angle with respect to an exposure dose.

FIG. 10 is a graph showing a contact angle with respect to an exposure dose.

With reference to FIG. 10, it can be seen that a contact angle of the hydrophobic layer of the surface of the organic film increases as the UV exposure dose increases. For example, it can be seen that the contact angle of the hydrophobic layer is 0 degrees (°) when the exposure dose is 130 mJ. In contrast, it can be seen that when the exposure doses are 140 mJ, 150 mJ, and 160 mJ, the contact angles of the hydrophobic layer respectively increase to 80 degrees (°), 90 degrees (°), and 91 degrees (°). For example, it can be seen that the contact angle of the hydrophobic layer does not increase any further when the exposure dose is 150 mJ or more.

To form the hydrophobic layer, the exposure dose, which is equal to or more than the exposure dose applied to the organic film, may be applied. The hydrophobic layer may be exposed so that the contact angle is 70 degrees (°) or more.

As described above, it can be seen that the hydrophobicity of the hydrophobic layer varies depending on the exposure dose, and there occurs a difference in hydrophobic properties in accordance with a curing rate of the surface.

Therefore, it is possible to control the degree of hydrophobicity of the hydrophobic layer by controlling the exposure dose. The reliability of the display panel may be improved in case that predetermined hydrophobic properties are ensured.

Meanwhile, the hydrophobic layer of the present disclosure may not only be formed on the upper side of the dam but also be formed on the side surface of the dam. This configuration will be described in detail with reference to the following drawing.

Figure 11:
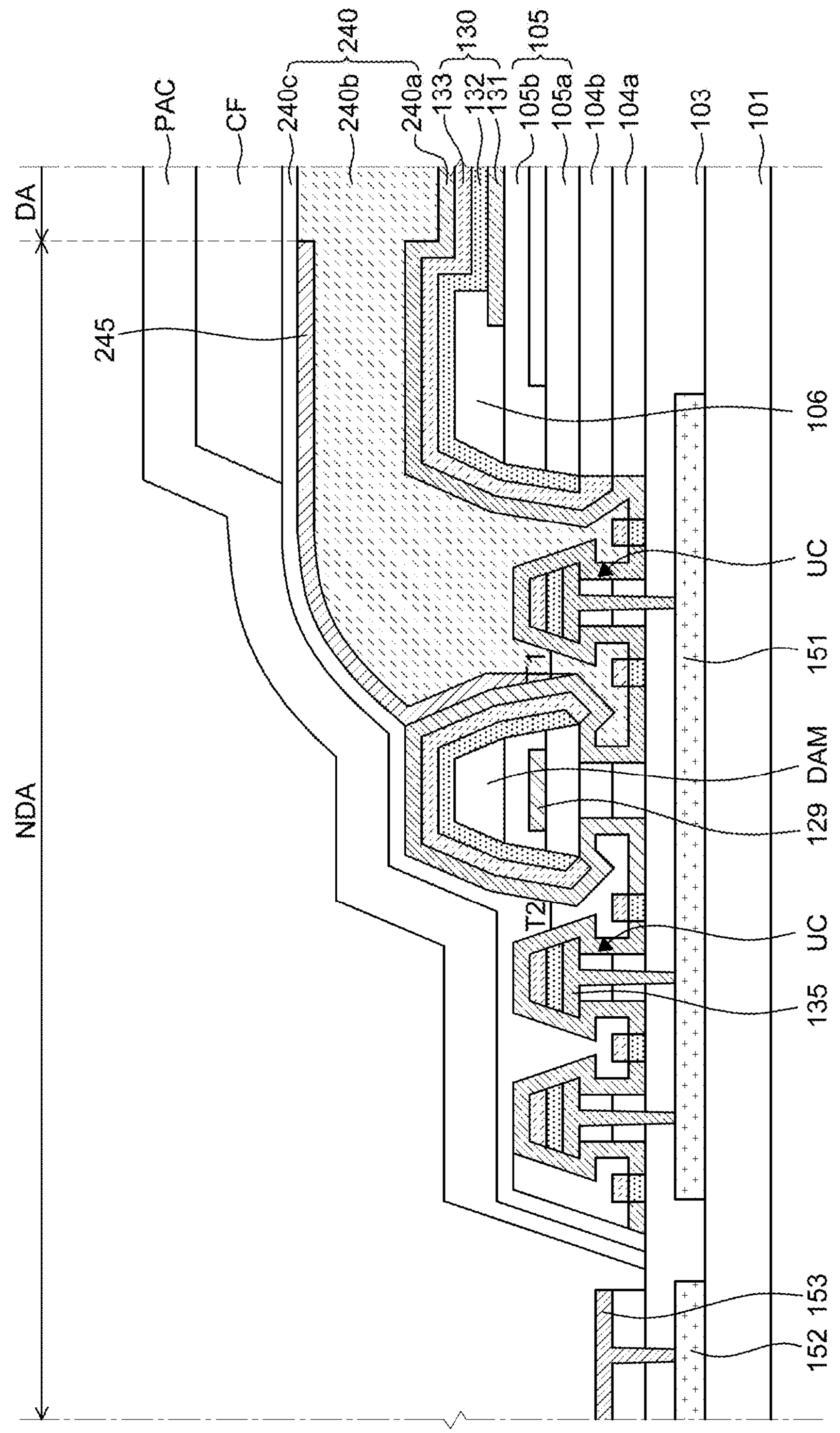
FIG. 11 is a cross-sectional view of a display device according to another example embodiment of the present disclosure.

FIG. 11 is a cross-sectional view of a display device according to another example embodiment of the present disclosure.

A display device according to another example embodiment of the present disclosure in FIG. 11 is substantially identical in configuration to the above-mentioned display device according to an example embodiment of the present disclosure in FIG. 4, except for a configuration of a hydrophobic layer 245. Therefore, repeated descriptions of the identical components will be omitted. For convenience, the driving element 120 in the display area DA is omitted from FIG. 11.

With reference to FIG. 11, in the display panel according to another example embodiment of the present disclosure, the light-emitting element 130 may be disposed on the upper portion of the substrate 101, and a sealing layer 240 having a multilayer structure may be disposed on the upper portion of the light-emitting element 130. For example, the sealing layer 240 may include a primary protective film 240*a* disposed on the upper portion of the substrate 101 on which the light-emitting element 130 is disposed, and an organic film 240*b* disposed on the primary protective film 240*a*, and a secondary protective film 240*c* disposed on the organic film 240*b*. However, the number of inorganic and organic films constituting the sealing layer 240 is not limited thereto.

For example, the primary protective film 240*a* may be made of an inorganic insulating material, such as silicon nitride (SiNx), oxidation silicon nitride (SiON), silicon oxide (SiOx), or aluminum oxide ($Al_2O_3$) that may be deposited at a low temperature.

The primary protective film 240*a* may be disposed on the cathode 133 on the upper portion of the dam DAM and the upper portion of the auxiliary electrode 135. For example, the primary protective film 240*a* may be disposed on the side surface of the dam DAM and the side surface of the auxiliary electrode 135 and the side surfaces of the trenches T1 and T2. The primary protective film 240*a* may expose the second pad electrode 153 of the pad part.

The organic film 240*b* may be disposed in a smaller area than the primary protective film 240*a*. The organic film 240*b* may be configured to expose two opposite ends of the primary protective film 240*a*. The organic film 240*b* may be made of an organic insulating material, such as acrylic resin, epoxy resin, polyimide, polyethylene, or silicon oxycarbon (SiOC).

In addition, the organic film 240*b* including an organic material may be provided only in the dam DAM. The organic film 240*b* may be disposed in the first trench T1 disposed inside the dam DAM. For example, the organic film 240*b* may fill the inside of the first trench T1.

Meanwhile, in another example embodiment of the present disclosure, the hydrophobic layer 245 may be formed on a part of the surface of the organic film 240*b* of the non-display area NDA. For example, the hydrophobic layer 245 may be provided in the boundary area between the non-display area NDA and the display area DA and formed to the primary protective film 240*a* disposed on the upper side and the side surface of the dam DAM. For example, the hydrophobic layer 245 may be additionally disposed on the side surface of the dam DAM, which faces the display area DA, and disposed from the upper side to the lower side of the dam DAM. Therefore, it is possible to further improve the reliability of the performance in suppressing moisture penetration by more effectively blocking moisture penetration to the upper edge as well as the outer peripheral portion of the sealing layer 240 including the side surface.

In addition, for example, the hydrophobic layer 245 may be in contact with the primary protective film 240*a* disposed from the upper side to the lower side of the dam DAM. The hydrophobic layer 245 may not be formed in the display area DA. For example, the hydrophobic layer 245 may be a hydrophobic fluorine film.

The secondary protective film 240*c* may be disposed to cover the top surface and the side surface of the primary protective film 240*a* and the top surface and the side surface of the organic film 240*b*. For example, the secondary protective film 240*c* may be made of an inorganic insulating material, such as silicon nitride (SiNx), silicon oxide (SiOx), oxidation silicon nitride (SiON), or aluminum oxide ($Al_2O_3$).

The secondary protective film 240*c* may be disposed on the primary protective film 240*a* on the upper portion of the dam DAM and the upper portion of the auxiliary electrode 135. The secondary protective film 240*c* may expose the second pad electrode 153 of the pad part.

The example embodiments of the present disclosure can also be described as follows:

According to an aspect of the present disclosure, there is provided a display device. The display device comprises a substrate including a display area and a non-display area, a planarization layer over the substrate, a light-emitting element over the planarization layer in the display area, and a sealing layer over the light-emitting element, an organic film of the sealing layer may have a hydrophobic layer on a surface of an outer peripheral portion thereof.

The hydrophobic layer may be formed on a surface of the organic film in the non-display area.

The hydrophobic layer may be made of hydrophobic fluorine.

The display device may further include a dam disposed over the substrate in the non-display area.

The sealing layer may comprise a primary protective film over the light-emitting element, the organic film on the primary protective film, and a secondary protective film on the organic film, wherein the primary protective film and the secondary protective film may be each made of an inorganic insulating material.

The primary protective film may be disposed over the dam.

The organic film may be in the non-display area surrounding the display area, and, in a plan view, the organic film may extend into a portion of the non-display area surrounded by the same. The organic film may be absent outside of the dam.

The hydrophobic layer may be in a boundary area between the non-display area and the display area and extended to an upper side of the dam.

The hydrophobic layer may be in contact with the primary protective film at the upper side of the dam.

The hydrophobic layer may include a fluorine additive, and the fluorine additive may be disposed on a surface of the organic film and may constitute the hydrophobic layer by cross-linking after UV exposure.

The organic film in an area, in which the hydrophobic layer is formed, may be irradiated with UV rays with an exposure dose higher than that in other areas.

The hydrophobic layer may be further formed on a side surface of the dam, and the hydrophobic layer may be in contact with the primary protective film on the side surface of the dam.

According to another aspect of the present disclosure, there is provided a display device. The display device comprises a substrate including a display area and a non-display area, a light-emitting element over the substrate in the display area, a dam over the substrate in the non-display area, and a sealing layer over the light-emitting element. An organic film of the sealing layer may be inside the dam in a plan view and may have a hydrophobic layer on a surface of an outer peripheral portion thereof that contacts the dam.

The hydrophobic layer may include a fluorine additive, and the fluorine additive may be on a surface of the organic film and may constitute the hydrophobic layer by cross-linking after UV exposure.

The organic film in an area, in which the hydrophobic layer is formed, may be irradiated with UV rays with an exposure dose higher than that in other areas.

The hydrophobic layer may be further formed on a side surface of the dam, and the hydrophobic layer may be in contact with the primary protective film on the side surface of the dam.

In another aspect, a display device may comprise a substrate including a display area and a non-display area; and a sealing layer over the substrate in the display area and the non-display area, wherein the sealing layer includes a hydrophobic layer in the non-display area to surround the display area.

The display device may further comprise a light emitting element over the substrate.

The display device may further comprise a dam over the substrate in the non-display area and surrounding the display area in a plan view.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a substrate including a display area and a non-display area;

a planarization layer over the substrate;

a light-emitting element over the planarization layer in the display area;

a dam over the substrate in the non-display area; and a sealing layer over the light-emitting element, wherein an organic film of the sealing layer has a hydrophobic layer on a surface of an outer peripheral portion thereof, the hydrophobic layer being located inside the dam in a plan view.

2. The display device of claim 1, wherein the hydrophobic layer is on a surface of the organic film in the non-display area.

3. The display device of claim 1, wherein the hydrophobic layer includes hydrophobic fluorine.

4. The display device of claim 1, wherein the sealing layer includes:

a primary protective film over the light-emitting element;

the organic film on the primary protective film; and a secondary protective film on the organic film, and wherein the primary protective film and the secondary protective film each include an inorganic insulating material.

5. The display device of claim 4, wherein a portion of the primary protective film is over the dam.

6. The display device of claim 4, wherein the dam is in the non-display area surrounding the display area, and wherein, in a plan view, the organic film extends into a portion of the non-display area surrounded by the dam, and the organic film is absent outside the dam.

7. The display device of claim 4, wherein the hydrophobic layer is in a boundary area between the non-display area and the display area and extended to an upper side of the dam.

8. The display device of claim 7, wherein the hydrophobic layer is in contact with the primary protective film at the upper side of the dam.

9. The display device of claim 4, wherein the hydrophobic layer includes a fluorine additive, and the fluorine additive is on a surface of the organic film.

10. The display device of claim 9, wherein a hydrophobicity of the fluorine additive of the hydrophobic layer is maintained by cross-linking after UV exposure.

11. The display device of claim 4, wherein the organic film in an area in which the hydrophobic layer is formed is irradiated with UV rays with an exposure dose higher than that in other areas.

12. The display device of claim 4, wherein the hydrophobic layer is further formed on a side surface of the dam, and the hydrophobic layer is in contact with the primary protective film on the side surface of the dam.

13. A display device, comprising:

a substrate including a display area and a non-display area;

a light-emitting element over the substrate in the display area;

a dam over the substrate in the non-display area and surrounding the display area in a plan view; and a sealing layer over the light-emitting element, wherein an organic film of the sealing layer is inside the dam in the plan view and has a hydrophobic layer on a surface of an outer peripheral portion thereof that contacts the dam, the hydrophobic layer being located inside the dam in the plan view.

14. The display device of claim 13, wherein the hydrophobic layer includes a fluorine additive, and the fluorine additive is on a surface of the organic film.

15. The display device of claim 14, wherein a hydrophobicity of the fluorine additive of the hydrophobic layer is maintained by cross-linking after UV exposure.

16. The display device of claim 13, wherein the organic film in an area in which the hydrophobic layer is formed is irradiated with UV rays with an exposure dose higher than that in other areas.

17. The display device of claim 13, wherein the hydrophobic layer is further formed on a side surface of the dam, and the hydrophobic layer is in contact with the primary protective film on the side surface of the dam.

18. A display device, comprising:

a substrate including a display area and a non-display area;

a sealing layer over the substrate in the display area and the non-display area; and a dam over the substrate in the non-display area and surrounding the display area in a plan view, wherein the sealing layer includes a hydrophobic layer in the non-display area to surround the display area, and the hydrophobic layer is located inside the dam in a plan view.

19. The display device of claim 18, further comprising a light emitting element over the substrate.

* * * * *